United States Patent
Wang

(10) Patent No.: US 11,094,750 B2
(45) Date of Patent: Aug. 17, 2021

(54) FLEXIBLE DISPLAY PANEL AND PREPARATION METHOD THEREOF

(71) Applicant: Yungu (Gu'an) Technology Co., Ltd., Langfang (CN)

(72) Inventor: Lijuan Wang, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 1 day.

(21) Appl. No.: 16/716,851

(22) Filed: Dec. 17, 2019

(65) Prior Publication Data

US 2020/0127063 A1     Apr. 23, 2020

Related U.S. Application Data

(63) Continuation of application No. PCT/CN2018/119522, filed on Dec. 6, 2018.

(30) Foreign Application Priority Data

Jun. 13, 2018 (CN) .......................... 201810610022.8

(51) Int. Cl.
*H01L 27/32* (2006.01)
*H01L 51/00* (2006.01)

(52) U.S. Cl.
CPC ...... *H01L 27/3218* (2013.01); *H01L 27/3246* (2013.01); *H01L 51/0097* (2013.01); *H01L 2227/323* (2013.01)

(58) Field of Classification Search
CPC combination set(s) only.
See application file for complete search history.

(56) References Cited

U.S. PATENT DOCUMENTS

| | | | |
|---|---|---|---|
| 9,306,180 B2 | 4/2016 | Kim | |
| 2016/0240802 A1* | 8/2016 | Lee | H01L 27/3241 |
| 2017/0040306 A1 | 2/2017 | Kim et al. | |
| 2017/0168342 A1* | 6/2017 | Park | G02F 1/1339 |
| 2018/0052493 A1 | 2/2018 | Hong et al. | |
| 2018/0197442 A1* | 7/2018 | Song | G02F 1/133514 |
| 2018/0350888 A1* | 12/2018 | Huo | H01L 51/0005 |
| 2020/0058713 A1* | 2/2020 | Zhang | C23C 14/24 |
| 2020/0184856 A1* | 6/2020 | Wang | H01L 51/52 |
| 2020/0203450 A1* | 6/2020 | Lou | H01L 27/3246 |
| 2020/0273924 A1* | 8/2020 | Xiao | C23C 14/04 |

(Continued)

FOREIGN PATENT DOCUMENTS

| | | |
|---|---|---|
| CN | 101577071 A | 11/2009 |
| CN | 105845702 A | 8/2016 |
| CN | 105977276 A | 9/2016 |

(Continued)

OTHER PUBLICATIONS

Chinese First Office Action for CN Application No. 201810610022.8 dated May 17, 2019.

(Continued)

*Primary Examiner* — Nduka E Ojeh
(74) *Attorney, Agent, or Firm* — Ladas & Parry LLP

(57) ABSTRACT

The flexible display panel includes a plurality of pixel units, each of the pixel units includes a plurality of sub-pixels having at least three emitting colors, and the sub-pixels with a same emitting color are arranged along a predetermined stretching direction.

17 Claims, 1 Drawing Sheet

(56) References Cited

U.S. PATENT DOCUMENTS

2020/0279979 A1* 9/2020 Lee .................... H01L 25/0753

FOREIGN PATENT DOCUMENTS

| CN | 106097898 A | 11/2016 |
| --- | --- | --- |
| CN | 106449710 A | 2/2017 |
| CN | 106784366 A | 5/2017 |
| CN | 107086239 A | 8/2017 |
| CN | 206505921 U | 9/2017 |
| CN | 107359176 A | 11/2017 |
| CN | 107978686 A | 5/2018 |
| CN | 108051943 A | 5/2018 |
| CN | 108847135 A | 11/2018 |
| EP | 3223326 A1 | 9/2017 |
| KR | 20160088523 A | 7/2016 |

OTHER PUBLICATIONS

Chinese Second Office Action for CN Application No. 201810610022.8 dated Oct. 21, 2019.
CN 108847135 A—English Translation.
CN 105845702 A—English Translation.
CN 107086239 A—English Translation.
CN 206505921 U—English Translation.
CN 101577071 A—English Translation.
CN 108051943 A—English Translation.
CN 106097898 A—English Translation.
CN 106449710 A—English Translation.
CN 106784366 A—English Translation.
CN 107359176 A—English Translation.
PCT International Search Report of PCT/CN2018/119522 dated Mar. 11, 2019.
PCT Written Opinion of PCT/CN2018/119522 dated Mar. 11, 2019.
Chinese Third Office Acton for CN Application No. 201810610022.8 dated Sep. 24, 2020.

* cited by examiner

FLEXIBLE DISPLAY PANEL AND PREPARATION METHOD THEREOF

CROSS-REFERENCE TO RELATED APPLICATIONS

This application is a continuation of International Application No. PCT/CN2018/119522 filed on Dec. 6, 2018, which claims priority to Chinese patent application No. 201810610022.8 filed on Jun. 13, 2018. Both applications are incorporated herein in their entireties by reference.

TECHNICAL FIELD

The present disclosure relates to the field of flexible display technology, and particularly to a flexible display panel and a preparation method thereof.

BACKGROUND

In recent years, a central position of the display market is gradually occupied by Flat Panel Display (FPD). Large size, thin and light display devices may be fabricated using the FPD. Such FPDs include Liquid Crystal Display (LCD), Plasma Display Panel (PDP), Organic Light Emitting Diode (OLED) display screens, and the like. Most of the current display screens use three-color sub-pixels as a primary color for color display, especially the application of RGB as three primary colors is most common. It is one of the most widely used color systems by changing color channels of red R, green G, and blue B and superimposing them on each other. With the development of science and technology, flexible displays have become a mainstream. The flexible displays may be divided into curved displays, foldable displays and stretchable displays, in order to obtain stretchable properties, a stretchable substrate may be used, and when the substrate is stretched, a pixel layer on the substrate is also deformed, which affects the display effect.

SUMMARY

In view of this, the present disclosure provides a flexible display panel and a preparation method thereof, which solves a problem that the display effect is deteriorated due to sub-pixels being stretched during a process of the flexible display panel being stretched.

The flexible display panel provided by the present disclosure includes: a plurality of pixel units, each of the pixel units includes a plurality of sub-pixels with at least three emitting colors, and the sub-pixels with a same emitting color are arranged along a same predetermined stretching direction.

In an embodiment, a shape of each of the pixel units is a regular hexagon composed of six regular triangles, each of the regular triangles constitutes said one of the sub-pixels, and the two sub-pixels located on opposite sides of the regular hexagon have a same emitting color.

In an embodiment, the two sub-pixels of any adjacent sides in the regular hexagon have different emitting colors.

In an embodiment, the two adjacent sub-pixels of two adjacent pixel units have the same emitting color.

In an embodiment, the two adjacent sub-pixels of the two adjacent pixel units are disposed with a common side.

In an embodiment, each of the pixel units includes a plurality of sub-pixels with three emitting colors of red, blue, and green.

In an embodiment, the flexible display panel further includes a pixel limiting layer disposed between sub-pixels with different emitting colors.

In an embodiment, the pixel limiting layer is made of a transparent organic material.

In an embodiment, the organic material is a macromolecular organosilicon compound.

In an embodiment, a material of the pixel limiting layer is polydimethylsiloxane.

In an embodiment, the six corners of the regular hexagon are rounded

In an embodiment, the three corners of the regular triangle are rounded.

A preparation method of the flexible display panel described above includes: providing a substrate; and evaporating a plurality of pixel, units on the substrate. Each of the pixel units includes a plurality of sub-pixels with at least three emitting colors, and the plurality of the sub-pixels are evaporated simultaneously in a predetermined stretching direction.

In an embodiment, a shape of each of the pixel units is a regular hexagon composed of six regular triangles, and each of the regular triangles constitutes said one of the sub-pixels. Each of the pixel units includes first sub-pixels located on two first opposite sides, second sub-pixels located on two second opposite sides, and third sub-pixels located on two third opposite sides. The plurality of the sub-pixels are evaporated simultaneously in a predetermined stretching direction includes: evaporating the first sub-pixels simultaneously along a first predetermined stretching direction, evaporating the second sub-pixels simultaneously along a second predetermined stretching direction, and evaporating the third sub-pixels simultaneously along a third predetermined stretching direction. The first predetermined stretching direction is perpendicular to the first opposite sides, the second predetermined stretching direction is perpendicular to the second opposite sides, and the third predetermined stretching, direction is perpendicular to the third opposite sides.

The present disclosure further provides a flexible display panel and a preparation method thereof. The flexible display panel includes a plurality of pixel units, each of the pixel units includes a plurality of sub-pixels with at least three emitting colors, and the sub-pixels with a same emitting color are arranged along a same, predetermined stretching direction. When a flexible display panel is stretched, the sub-pixels are stretched slightly. By setting emitting colors of the plurality of sub-pixels in the predetermined stretching direction to the same emitting color, when one of the sub-pixels is stretched slightly, the other two adjacent sub-pixels with the same emitting color may play a role in compensation, such that eliminating influences when sub-pixels are stretched, and solving a problem that the display effect is deteriorated due to the sub-pixels being stretched during, a process of the flexible display panel being stretched.

DETAILED DESCRIPTION

A clear and complete description of technical solutions of the embodiments of the present disclosure will be given below, in combination with the accompanying drawings in the embodiments of the present disclosure. Apparently, the embodiments described below are a part, but not all, of the embodiments of the present disclosure of other embodiments, Obtained by those skilled in the art according to the embodiments of the present disclosure without any inventive efforts, fall into the protection scope of the present disclosure.

Figure 1:
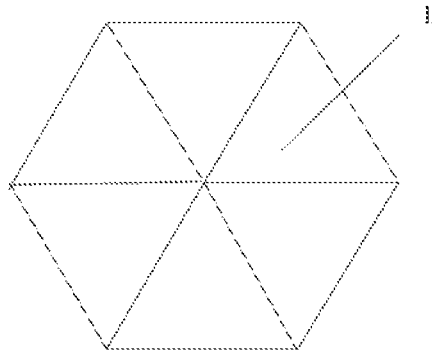
FIG. 1 is a schematic structural diagram of a pixel unit according to an embodiment of the present disclosure.

FIG. 1 is a schematic structural diagram of a pixel unit according to an embodiment of the present disclosure.

As shown in FIG. 1, the flexible display panel includes a plurality of pixel units, and each of the pixel units further includes a plurality, of sub-pixels 1 with at least three emitting colors, the plurality of pixel units are arranged in an array. Sub-pixels 1 with a same emitting color are arranged along a same predetermined stretching direction. For example, the display panel includes a plurality of pixel units with three emitting colors, which are first pixel units, second pixel units, and third pixel units respectively. The first pixel units are arranged along a first stretching direction, the second pixel units are arranged along a second stretching direction, and the third pixel units are arranged along a third stretching direction.

The flexible display panel has a stretchable property, and the predetermined stitching direction is a direction in which the flexible display panel may be stretched. The sub-pixels 1 in the same predetermined stretching direction have the same emitting color, ensuring that when the flexible display panel is stretched, although the sub-pixels 1 are stretched slightly, the other sub-pixels 1 with the same emitting color in the same predetermined stretching direction may play a role in compensation, eliminating a problem that the sub-pixels 1 are stretched to affect the display effect.

The emitting colors of a plurality of sub-pixels 1 in the predetermined stretching direction may be red, green or blue and the like, and the specific emitting color of the sub-pixels 1 is not limited in the present disclosure.

In an embodiment of the present disclosure, a shape of one of the pixel units is a regular hexagon composed of six regular triangles. Each of the regular triangles constitutes one sub-pixel 1, so that one pixel unit is composed of six sub-pixels 1. Sub-pixels 1 located on opposite sides of the regular hexagon have a same emitting color, and two sub-pixels 1 located on any adjacent side of one pixel unit have different emitting colors. In the embodiment, each of the pixel units has a regular hexagonal structure, and the sub-pixels 1 located on the opposite sides of the regular hexagon have the same emitting color. It may be seen from the structure of the above pixel units that there are three sub-pixels with different emitting colors in the embodiment, and three different predetermined stretching directions. The three different predetermined stretching directions are perpendicular to three opposite sides of the regular hexagon respectively.

In the embodiment of the present disclosure, a shape of each of the sub-pixels 1 is designed as an regular triangle, which may ensure that the sub-pixels 1 are stable and are not deformed easily, and one of the pixel units thus designed includes six sub-pixels, and each of the sub-pixels 1 is used twice repeatedly, increasing the utilization rate of the sub-pixels 1. Since the two sub-pixels 1 located on the opposite sides of the regular hexagon have the same emitting color, the plurality of sub-pixels 1 arranged in the same predetermined stretching direction are symmetrical, so that when a flexible display panel is stretched, one of the sub-pixels 1 is slightly stretched, and since the plurality of sub-pixels 1 in the predetermined stretching direction have the same emitting color, the other two adjacent sub-pixels 1 with the same emitting color may play a role in compensation, such that eliminating influences when the sub-pixels 1 are stretched, and solving a problem that the display effect is deteriorated due to the sub-pixels 1 being stretched during a process of the flexible display panel being stretched.

The plurality of pixel units should include red, blue and green, or include other emitting colors and the like, the present disclosure does not limit what emitting color the pixel units specifically includes.

The emitting color of the light emitted by the sub-pixels 1 distributed on different opposite sides in pixel units group may be selected according to actual needs and manufacturing processes. The present disclosure does not limit the emitting color of the light emitted by the sub-pixels 1 distributed on different opposite sides in the pixel units group.

In actual applications, the shape of the pixel unit may also be partially deformed, for example, six corners of the regular hexagon may be rounded and present a certain degree of curvature; and/or the shape of the sub-pixels 1 may also be partially deformed, for example, three corners of the triangle are rounded and present a certain degree of curvature. The present disclosure does not limit the shape of the pixel units.

Figure 2:
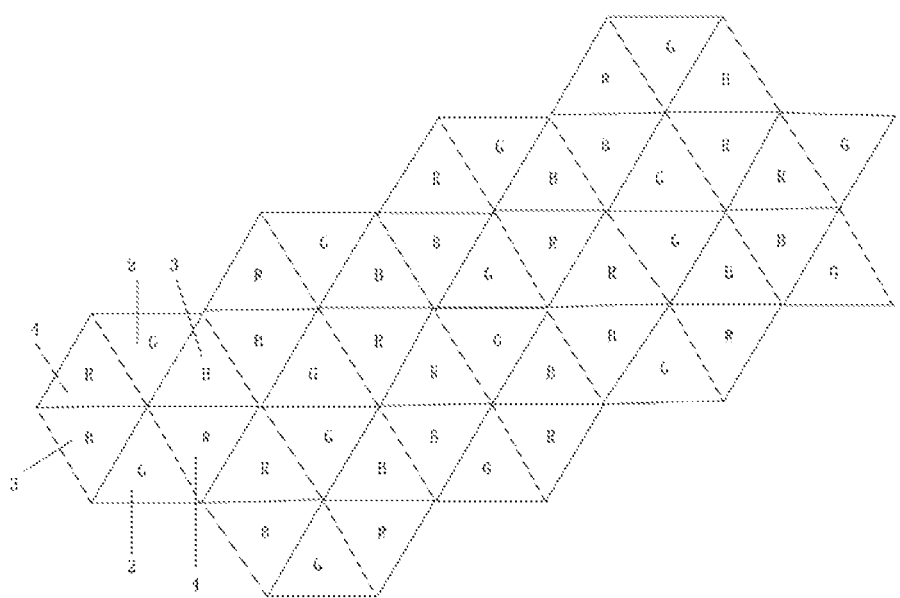
FIG. 2 is a schematic structural diagram of a flexible display panel according to an embodiment of the present disclosure.

FIG. 2 is a schematic structural diagram of a flexible display panel according to an embodiment of the present disclosure.

As shown in FIG. 2, it may be known from the above embodiment that the flexible display panel includes a plurality of pixel units, and two adjacent sub-pixels 1 of adjacent pixel units may have a same emitting color, which ensures that when one of the sub-pixels 1 of the flexible display panel is stretched, the other two adjacent sub-pixels 1 with the same emitting color may play a role in compensation, since emitting colors of a plurality of sub-pixels 1 in a predetermined stretching direction are the same, so as not to affect the display effect when the sub-pixels 1 are being stretched.

In an embodiment of the present disclosure, a plurality of pixel units are alternately arranged side to side, and two adjacent (the same emitting color) sub-pixels of two adjacent pixel units are disposed side to side, two adjacent sub-pixels of the two adjacent pixel units may be disposed with a common side. Two sub-pixels with the same emitting color may be evaporated in a same frame, which is beneficial to reducing the process difficulty of a mask and optimizing the evaporation effect.

The specific site of the regular hexagon and the regular triangle is not limited in the present disclosure.

In an embodiment of the present disclosure, each of the pixel units includes first sub-pixels 2 located on two first opposite sides, second sub-pixels 3 located on two second opposite sides, and third sub-pixels 4 located on two third opposite sides. The first sub-pixels 2, the second sub-pixels 3, and the third sub-pixels 4 are red, blue, and green, respectively. For example, the first sub-pixels 2 are red, the second sub-pixels 3 are blue, and the third sub-pixels 4 are green, and the like. Therefore, it may ensure that one pixel unit has three emitting colors of red, blue, and green at the same time, thereby ensuring the emitting and display effect of the display panel. When the flexible display panel is stretched, one of the sub-pixels 1 is also stretched slightly, the other two adjacent sub-pixels 1 with the same emitting color may play a role in compensation, such that eliminating influences when the sub-pixels 1 are being stretched, thereby improving the display effect of the flexible display panel.

In an embodiment of the present disclosure, the flexible display panel includes a pixel limiting layer disposed between sub-pixels 1 with different emitting colors in a same pixel unit. The pixel limiting layer may isolate the sub-pixels 1 with different emitting colors to prevent mutual influence between the sub-pixels 1 with different emitting colors. The pixel limiting layer has stretchable property and optical transparency property. Since the pixel limiting layer is transparent, it ensures that on the premise of the pixel limiting layer does not affect the display effect of the flexible display panel, when the flexible display panel is stretched, the pixel limiting layer is stretched at the same time due to the stretchable property of the pixel limiting layer, and then reduce the case where the sub-pixels 1 are stretched may be reduced, in order to prevent the stretching of the sub-pixels 1 from affecting the display effect.

The flexible display panel may include the pixel limiting layer or not, and the present disclosure does not limit whether the flexible display panel includes the pixel limiting layer.

In an embodiment of the present disclosure, the pixel limiting layer may be made of a transparent organic material, and the transparent organic material may be a macromolecular organosilicon compound, including polydimethylsiloxane. Polydimethylsiloxane is used as a material of the pixel limiting layer, due to its high tensile properties, and its transparent material. While the polydimethylsiloxane does not affect the display effect of the flexible display panel, when the flexible display panel is stretched, the polydimethylsiloxane is stretched simultaneously due to the stretchable property of the polydimethylsiloxane, and it is possible to reduce the case where the sub-pixels 1 are stretched, and prevent the sub-pixels 1 from being stretched to affect the display effect. And polydimethylsiloxane is stable, non-toxic and harmless.

The pixel limiting layer may be made of polydimethylsiloxane or other materials, and the disclosure does not limit the specific material of the pixel limiting layer.

In an embodiment of the present disclosure, a preparation method of a flexible display panel includes: evaporating a plurality of pixel units on a substrate. Evaporating is evaporating or sublimating substance to be film in a vacuum. In the embodiment, the sub-pixels 1 with different emitting colors are evaporated on the substrate. Since the emitting colors of the sub-pixels 1 in the predetermined stretching direction are the same, evaporating may be performed synchronously, thereby reducing the number of evaporations and reducing the process cost.

The sub-pixels 1 in the predetermined stretching direction may be evaporated simultaneously or not, and the present disclosure does not limit whether the sub-pixels 1 in the predetermined stretching direction are evaporated simultaneously.

In an embodiment of the present disclosure, the shape of the pixel unit is a regular hexagon composed of six regular triangles, and each of the regular triangles is a sub-pixel 1. Sub-pixels 1 located on the opposite sides of the regular hexagon have the same emitting color, and each of the sub-pixels 1 adjacent in one pixel unit have different emitting colors. The pixel unit includes first sub-pixels 2 located on two first opposite sides of the regular hexagon, second sub-pixels 3 located on two second opposite sides of the regular hexagon, and third sub-pixels 4 located on two third opposite sides of the regular hexagon. Synchronous evaporation of a plurality of sub-pixels 1 in a predetermined stretching direction includes: evaporating the first sub-pixel 2 simultaneously along a first predetermined stretching direction, the first predetermined stretching direction being perpendicular to the first opposite sides; evaporating the second sub-pixels 3 simultaneously along a second predetermined stretching direction, the second predetermined stretching direction being perpendicular to the second opposite sides; and evaporating the third sub-pixels 4 simultaneously along a third predetermined stretching direction, the third predetermined stretching direction being perpendicular to the third opposite sides. The first sub-pixels 2 in the first stretching direction, the second sub-pixels 3 in the second stretching direction, and the third sub-pixels 4 in the third stretching direction are arranged in a plurality of rows. The sub-pixels 1 in the same predetermined direction have the same emitting color, and may be evaporated at the same time, therefore reducing the number of evaporations and the process cost greatly.

The emitting colors of the sub-pixels 1 in different predetermined stretching directions may be selected according to actual needs. In other embodiments of the present disclosure, the emitting color in the first predetermined stretching direction may be red, the emitting color in the second predetermined stretching direction may be blue, and the emitting color in the third predetermined stretching direction may be green.

The order of evaporating the sub-pixels 1 of the same emitting color in different predetermined stretching directions may be adjusted according to actual needs. In other embodiments of the present disclosure, sub-pixels 1 in the first predetermined stretching direction may be evaporated firstly, sub-pixels 1 in the second predetermined stretching direction are further evaporated, and sub-pixels 1 in the third predetermined stretching direction are evaporated finally. In another embodiment of the present disclosure, the sub-pixels 1 in the third predetermined stretching direction may be evaporated firstly, the sub-pixels 1 in the first predetermined stretching direction are further evaporated, and the sub-pixels 1 in the second predetermined stretching are evaporated finally. Therefore, the present disclosure does not limit the order of evaporating the sub-pixels 1 of the same emitting color in different predetermined stretching directions.

The above description is only for the preferred embodiment of the present disclosure, and is not intended to limit the present disclosure. Any modifications, equivalents, and the like made within the spirit and principles of the present disclosure are included in the scope of protection of the present disclosure.

What is claimed is:

1. A flexible display panel, comprising a plurality of pixel units, wherein each of the pixel units comprises a plurality of sub-pixels having at least three emitting colors;
   the sub-pixels with a same emitting color are arranged along a predetermined stretching direction;
   a pixel limiting layer disposed between the sub-pixels with different emitting colors, and the pixel limiting layer has a stretchable property to reduce a stretching between the sub-pixels with different emitting colors; and
   the flexible display panel is stretched in three different predetermined stretching directions, the flexible display panel comprises three different kinds of sub-pixels with three different emitting colors, and the three different kinds of sub-pixels are arranged along the three different predetermined stretching directions respectively.

2. The flexible display panel according to claim 1, wherein a shape of each of the pixel units is a regular hexagon composed of six regular triangles, each of the regular triangles constitutes one of the sub-pixels, and two of the sub-pixels located on opposite sides of the regular hexagon have a same emitting color.

3. The flexible display panel according to claim 2, wherein two of the sub-pixels of any adjacent sides in the regular hexagon have different emitting colors.

4. The flexible display panel according to claim 2, wherein two adjacent sub-pixels of two adjacent pixel units have the same emitting color.

5. The flexible display panel according to claim 4, wherein the two adjacent sub-pixels of the two adjacent pixel units are disposed with a common side.

6. The flexible display panel according to claim 2, wherein six corners of the regular hexagon are rounded.

7. The flexible display panel according to claim 2, wherein three corners of the regular triangle are rounded.

8. The flexible display panel according to claim 2, wherein two adjacent sub-pixels arranged along the same predetermined stretching direction are symmetrical.

9. The flexible display panel according to claim 1, wherein each of the pixel units comprises a plurality of sub-pixels with three emitting colors of red, blue, and green.

10. The flexible display panel according to claim 1, wherein the pixel limiting layer is made of a transparent organic material.

11. The flexible display panel according to claim 10, wherein the transparent organic material is a macromolecular organosilicon compound.

12. The flexible display panel according to claim 10, wherein a material of the pixel limiting layer is polydimethylsiloxane.

13. The flexible display panel according to claim 1, wherein the pixel limiting layer has an optical transparency property to ensure the pixel limiting layer does not affect a display effect of the flexible display panel.

14. The flexible display panel according to claim 1, wherein the flexible display panel is a stretchable flexible display panel.

15. A preparation method of a flexible display panel, comprising:
    providing a substrate;
    evaporating a plurality of pixel units on the substrate, each of the pixel units comprises a plurality of sub-pixels having at least three emitting colors, the plurality of the sub-pixels are evaporated simultaneously in a predetermined stretching direction; and
    preparing a pixel limiting layer, wherein the pixel limiting layer is disposed between the sub-pixels with different emitting colors, the pixel limiting layer has a stretchable property to reduce a stretching between the sub-pixels with different emitting colors; and
    the flexible display panel is stretched in three different predetermined stretching directions, the flexible display panel comprises three different kinds of sub-pixels with three different emitting colors, and the three different kinds of sub-pixels are arranged along the three different predetermined stretching directions respectively.

16. The preparation method according to claim 15, wherein the pixel limiting layer has an optical transparency property to ensure the pixel limiting layer does not affect a display effect of the flexible display panel.

17. A preparation method of a flexible display panel, comprising:
    providing a substrate; and
    evaporating a plurality of pixel units on the substrate, each of the pixel units comprises a plurality of sub-pixels having at least three emitting colors, the plurality of the sub-pixels are evaporated simultaneously in a predetermined stretching direction,
    wherein a shape of each of the pixel units is a regular hexagon composed of six regular triangles, each of the regular triangles constitutes one of the sub-pixels, and each of the pixel units comprises first sub-pixels located on two first opposite sides of the regular hexagon, second sub-pixels located on two second opposite sides of the regular hexagon, and third sub-pixels located on two third opposite sides of the regular hexagon; and
    the plurality of the sub-pixels are evaporated simultaneously in a predetermined stretching direction comprises:
    evaporating the first sub-pixels simultaneously along a first predetermined stretching direction, evaporating the second sub-pixels simultaneously along a second predetermined stretching direction, and evaporating the third sub-pixels simultaneously along a third predetermined stretching direction; and
    the first predetermined stretching direction is perpendicular to the first opposite sides, the second predetermined stretching direction is perpendicular to the second opposite sides, and the third predetermined stretching direction is perpendicular to the third opposite sides.

* * * * *